(12) United States Patent
Jun et al.

(10) Patent No.: US 7,790,246 B2
(45) Date of Patent: Sep. 7, 2010

(54) ULTRA HYDROPHILIC TI-O-C BASED NANO FILM AND FABRICATION METHOD THEREOF

(75) Inventors: Hyun-Woo Jun, Gyeongsangnam-Do (KR); Chang-Il Jung, Busan (KR); Young-Man Jeong, Gyeongsangnam-Do (KR)

(73) Assignee: LG Electronics Inc., Seoul (KR)

( * ) Notice: Subject to any disclaimer, the term of this patent is extended or adjusted under 35 U.S.C. 154(b) by 726 days.

(21) Appl. No.: 11/628,962

(22) PCT Filed: Dec. 30, 2004

(86) PCT No.: PCT/KR2004/003532

§ 371 (c)(1),
(2), (4) Date: Dec. 8, 2006

(87) PCT Pub. No.: WO2006/070956

PCT Pub. Date: Jul. 6, 2006

(65) Prior Publication Data

US 2008/0063895 A1      Mar. 13, 2008

(51) Int. Cl.
*H05H 1/24*      (2006.01)
(52) U.S. Cl. ........................... 427/576; 427/209
(58) Field of Classification Search ........... 427/569, 427/576
See application file for complete search history.

(56) References Cited

U.S. PATENT DOCUMENTS 6,096,133 A * 8/2000 Yuuki et al. ............... 118/712

2004/0180216 A1 * 9/2004 Veerasamy et al. ........ 428/432

FOREIGN PATENT DOCUMENTS

| JP | 10-298761 | * | 11/1998 |
| JP | 2001-280879 | * | 10/2001 |
| WO | WO-01/79584 A1 | | 10/2001 |
| WO | WO-02/28552 A1 | | 4/2002 |
| WO | WO-2004/099463 A2 | | 11/2004 |
| WO | WO-2005/098074 A1 | | 10/2005 |

OTHER PUBLICATIONS

Da Cruz, Properties of titanium oxide films obtained by PECVD, Surface and Coatings Technology, vol. 126, Issues 2-3, Apr. 24, 2000, pp. 123-130.*
Cho et al, Thermodynamic Analysis of Liquid Source Chemical Vapor Deposition Process for the Preparation of a Ba-Sr-Ti Oxide Film, Korean J. Chem. Eng., 21(1), Jan. 2004, pp. 286-291.*

* cited by examiner

*Primary Examiner*—Timothy H Meeks
*Assistant Examiner*—Elizabeth Burkhart
(74) *Attorney, Agent, or Firm*—Birch, Stewart, Kolasch & Birch LLP

(57) ABSTRACT

An ultra-hydrophilic Ti—O—C based nano-film of which deposition thickness was improved and deposition uniformity was excellent was fabricated by mixing a Ti precursor and a liquid having a low boiling point and a high volatility—at a uniform ratio. The catalyst accelerates a vaporization of the Ti precursor and facilitates the Ti precursor to be injected into a reaction chamber, thereby improving plasma polymerization efficiency.

14 Claims, 3 Drawing Sheets

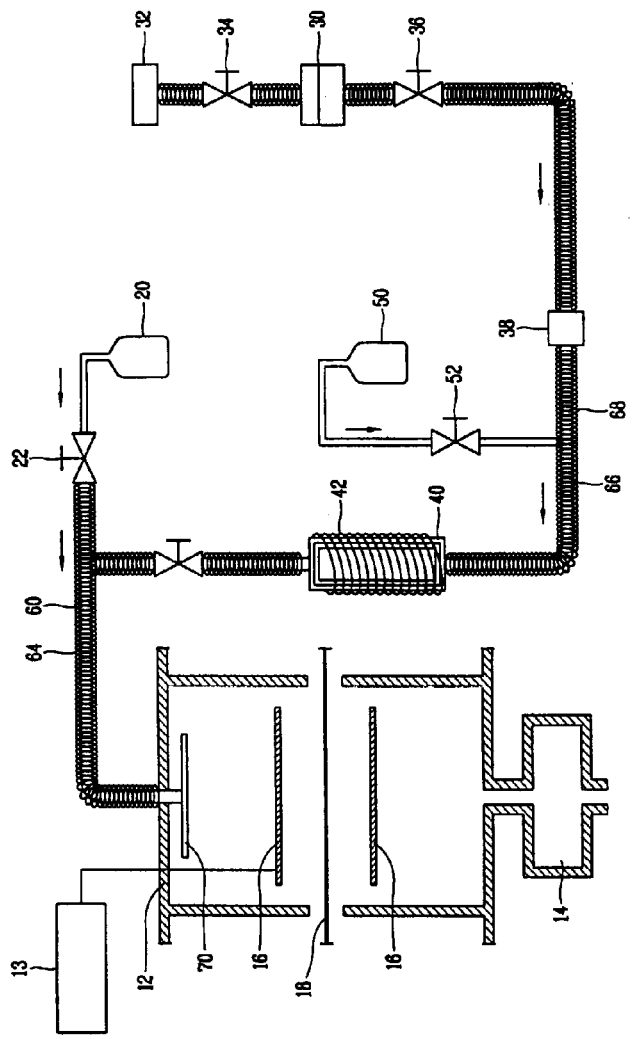
[Fig. 1]
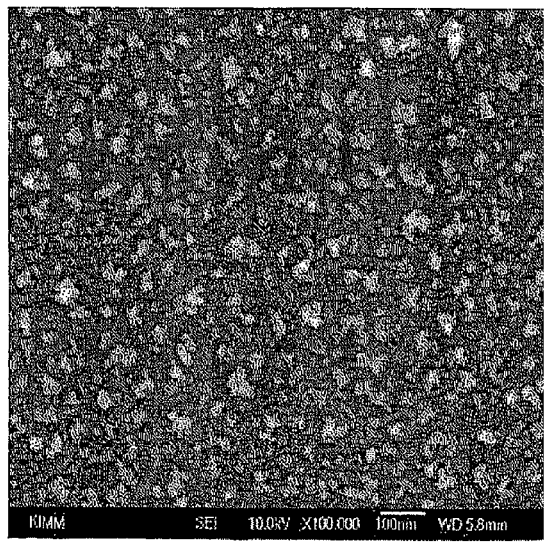
[Fig. 2]

ULTRA HYDROPHILIC TI-O-C BASED NANO FILM AND FABRICATION METHOD THEREOF

TECHNICAL FIELD

The present invention relates to an ultra hydrophilic Ti—O—C based nano film and a method for fabricating the same.

BACKGROUND ART

A method for changing surface characteristics by forming a film on the material surface has been frequently used in various industrial fields. For instance, by forming an appropriate surface layer additionally on the material surface, it is possible to improve a mechanical strength, to allow electrical insulating properties or conductivity, to allow hydrophile properties, or to improve corrosion resistance.

A heat-exchanger for contacting two fluids having different temperatures from each other to exchange heat has been broadly used in various industrial fields. In particular, a refrigeration air conditioning heat-exchanger additionally uses fin structures for increasing a heat transfer surface of a heat exchanger tube in order to improve heat transfer.

When wet air passes through a heat-exchanger fin, heat transfer occurs between the wet air and a refrigerant of a low temperature supplied through the heat exchanger tube. In this case, when a temperature of the fin surface is lower than a dew-point temperature of the wet air, droplets are condensed on the heat exchanger fin surfaces and the droplets interfere with air flow. Therefore, an operation power of the fan should be increased in order to supply the same flow rate of air, which results in an increase in power consumption.

In the conventional art, a heat exchanger fin structure had an anticorrosive processing performed thereon by using $Cr^{+6}$ and a silicate-based coating films was formed thereon to thus improve hydrophile properties to allow a condensed water formed on the fin surfaces to easily flow downward. However, in the conventional hydrophilic coating, its hydrophilic characteristics are decreased as time passes.

In addition, in the conventional art, a hydrocarbon polymer film was formed on the heat exchanger fin surfaces to improve hydrophile properties and aging characteristics. However, it was impossible to achieve other advantageous effects such as antibiosis, deodorization or the like. Also, it was inconvenient to perform a separate coating operation for achieving additional advantageous effects.

In the coating film according to the conventional art, on the other hand, uniformity thereof was degraded, and deposition efficiency was lowered during surface processing.

DISCLOSURE OF THE INVENTION

Therefore, it is an object of the present invention to provide an ultra-hydrophilic film having superior hydrophile properties and aging characteristics.

According to another object of the present invention, there is provided a nano-film which can achieve superior deposition efficiency and uniform deposition.

According to still another object of the present invention, there is provided a method for fabricating an ultra-hydrophilic nano-film having excellent productivity and economical efficiency.

To achieve these objects, there is provided a method for fabricating an ultra-hydrophilic Ti—O—C based nano-film including: positioning a substrate to be surface-treated at a reaction chamber in a vacuum state in which one or more electrodes are installed; injecting into the reaction chamber a Ti precursor gas, a reactive gas selected between air and oxygen, and a volatile catalytic gas having a low boiling point as a deposition accelerant of Ti; applying a high voltage to the electrode to transmute the gases into a plasma state; and forming a Ti—O—C based nano-film on at least one surface of the substrate to be surface-treated.

The volatile catalyst may be one selected among DMB (di-methyl butadiene), THF (tetra hydro furan) and Hexane, and may also be other volatile materials having a low boiling point.

The Ti precursor may use titanium tetraisopropoxide [Ti$(OC_3H_7)_4$], but not limited thereto.

Preferably, for the Ti precursor, a liquid phase precursor is vaporized to a vapor phase precursor to be introduced into the reaction chamber.

The substrate to be surface-treated is a metal, and preferably contains aluminum, copper, or a metal sheet having superior heat conductivity.

A direct current (DC) high voltage is applied to the substrate to be surface-treated, and accordingly the substrate itself can be used as an electrode. In this case, the substrate may preferably be a positive (+) electrode.

The Ti precursor may be delivered to the reaction chamber by a separate carrier gas. In this case, the carrier gas can be selected among He, $N_2$ and Ar.

A ratio of the Ti precursor and the volatile catalyst may preferably be 70:30~50:50.

In addition, the present invention provides an ultra-hydrophilic Ti—O—C based nano-film, as the nano-film formed on a surface of a substrate, composed of a Ti precursor, a reactive gas selected between air and oxygen and a Ti—O—C based compound obtained from a volatile catalyst having a low boiling point as the deposition accelerant of Ti.

A thickness of the nano-film is preferably 1 to 100 nm, and a metal, particularly, an aluminum sheet for a heat exchanger fin is used as the substrate to be surface-treated.

BRIEF DESCRIPTION OF THE DRAWINGS

FIG. 1 is a conceptual diagram illustrating a plasma polymerization device for forming an ultra-hydrophilic coating film in accordance with the present invention;

FIG. 2 is an SEM photograph illustrating a microstructure of a titanium compound film coated on an aluminum surface;

MODES FOR CARRYING OUT THE PREFERRED EMBODIMENTS

Figure 3:
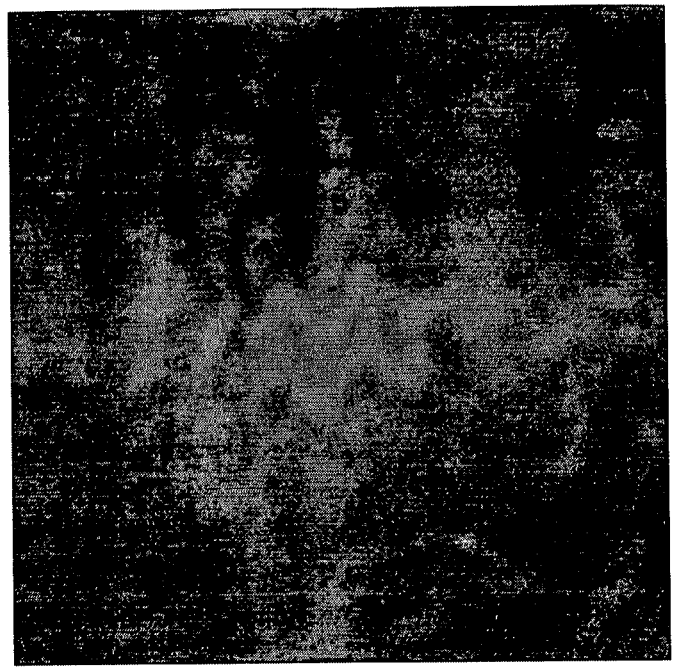
FIGS. 3 and 4 are photographs comparing a non-coated aluminum surface with a coated aluminum surface.

It will be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

FIG. 1 illustrates a plasma polymerization device for coating an ultra-hydrophilic titanium compound on a sheet-shaped metal substrate to be surface-treated according to the present invention.

The plasma polymerization device is composed of a reaction chamber maintained in a vacuum state and forming a plasma therein, and a gas supplying system for introducing a gas such as a reactive gas, a vapor phase precursor or a carrier gas into the reaction chamber.

The reaction chamber 12 is connected to a vacuum pump 14 for forming a vacuum in the chamber, and a substrate to be surface-treated 18 (e.g., a metal sheet), as a target to be polymerized, is provided between electrodes 16 installed to face each surface thereof and having spaces therebetween at upper and lower or left and right sides of the substrate. When power is applied to the electrodes 16 from a power supplying unit 13, gases supplied into the reaction chamber 12 are transmuted into a plasma state between the electrodes 16. The gases in the plasma state are polymerized on the surface of the substrate 18 and accordingly a compound film is coated thereon.

Various types of gases may be used as the gas supplied into the reaction chamber according to characteristics of a polymerized film to be formed.

For instance, a reactive gas such as air, oxygen, nitrogen, or the like, is introduced into the reaction chamber 12 through a pipe 60 via a valve 22 from a reactive gas cylinder 20.

In addition, as another reactive gas, a liquid phase precursor accommodated in a storing container 30 to which a pressure portion 32 applies pressure is introduced into a vaporizer 40 by a pressure difference through a mass flow controller 38, and the vapor phase precursor vaporized at the vaporizer 40 is introduced into the reaction chamber 12. The reference numerals 34 and 36 refer to valves.

Preferably, the carrier gas that can be helium (He), argon (Ar) or nitrogen ($N_2$) is introduced into a pipe 66 between the mass flow controller 38 and the vaporizer 40, thereby allowing the vapor phase precursor to be introduced into the reaction chamber 12. These carrier gases are accommodated in the carrier gas cylinder 50 and introduced into the pipe 66 through a separate valve 52.

The vaporizer 40 has a structure that a heater coil wraps the circumference thereof for heating and vaporizing a liquid phase titanium precursor.

In this structured plasma polymerization device, the reactive gas that can be air or oxygen ($O_2$), the vapor phase precursor (e.g., a titanium precursor or a silicon precursor) and the carrier gas are preferably introduced into the reaction chamber 12 to form a nano-plasma coating layer on the substrate 18 by plasma polymerization.

An introduction amount of the vapor phase precursor into the reaction chamber is controlled by adjusting the amount of liquid phase titanium tetraisopropoxide, which is a liquid phase precursor introduced into the vaporizer 40 (e.g., the titanium precursor).

During this process, the reactive gas, the vapor phase titanium precursor and the carrier gas, as shown in the FIG. 1, may be introduced into the reaction chamber 12 through a single pipe 60 at the outside of the reaction chamber 12, or introduced into the reaction chamber 12 through separate pipes. As shown in FIG. 1, the pipe 60 is introduced through a hole at one side of the reaction chamber 12, but it is more preferable to form an outlet of the pipe 60, namely, a gas discharge opening 70 is located adjacent to an upper/lower surface of the substrate 18, in order to discharge the mixed gas introduced through the pipe 60 directly above or directly under the substrate 18 to be coated.

As a second reactive gas, in case of using a vapor phase precursor to be easily condensed at a low temperature, when the pipe 60 is at a high temperature, the vapor phase precursor is condensed on the inner walls of the pipe 60. To prevent this, it is preferable to wind hot wires 64 around the exterior of the pipe 60 in which the vapor phase precursor flows to maintain the pipe 60 to be above a certain temperature. The above is also true for the pipe 66 with a region in which the liquid phase precursor gas flows. The exterior of the pipe 66 is wound by hot wires 68 to maintain a certain temperature, so that it is possible to prevent the liquid precursor from being condensed on inner walls of the pipe 66.

Embodiment

Hydrophilic Ti—O—C Based Compound Film Coating

An ultra-hydrophilic compound film was successively coated on a metal sheet 18 (i.e., the substrate to be surface-treated, namely, the substrate), that is continuously introduced into the reaction chamber 12 having the aforementioned construction by using a plasma.

First of all, a vacuum up to $10^{-3}$ Torr was formed in the reaction chamber 12 by using a vacuum pump 14, and accordingly the metal sheet 18 was continuously introduced between the electrodes 16 installed at upper and lower sides in the reaction chamber 12. An aluminum sheet used for a heat exchanger fin was provided as the metal sheet. Depending on the plasma generated between the electrodes, the ultra-hydrophilic titanium compound film was successively coated on both surfaces of the metal sheet 18. The metal sheet 18 is then discharged from the reaction chamber 12. A power supply applies power to the electrodes 16. DC voltage or RF voltage may be used as the power.

In some cases, the power can be applied directly to the metal sheet by using such as an electrode. In this case, preferably, electric current is applied in order for the metal sheet to be an anode. Although there are differences based on the types of gases that are used, the desired effects may be checked through experimentation to achieve better coating efficiency with respect to the anode. When connecting the metal sheet to the anode, a distance between the metal sheet and each electrode 16 was maintained to be about 30~150 mm.

Either air or oxygen, as the reactive gas, was introduced into the reaction chamber 12 through the valve 22 from the reactive gas cylinder 20.

In addition, the titanium tetraisopropoxide [$Ti(OC_3H_7)_4$] of a liquid state was vaporized at the vaporizer 40 and the vapor phase titanium precursor was introduced into the reaction chamber 12. A heater coil 42 of the vaporizer was ohmically heated to achieve a temperature range of 80° C.~120° C. for vaporizing the liquid phase precursor. Also, the hot wires wound around the outer walls of the pipes 60 and 66 were ohmically heated up to a temperature range of 80° C.~120° C. so that the titanium precursor was prevented from being condensed on the inner walls of the pipes.

If desirable, the titanium precursor may be mixed with a small amount of silicon precursor. The silicon can enhance corrosion resistance of the coating film formed on the surface of the substrate and improve aging characteristics thereof.

Either helium or argon, as the carrier gas, was introduced into the pipe 66 between the mass flow controller 38 and the vaporizer 40 to support the vapor phase titanium precursor (and the vapor phase silicon precursor) to be introduced into the reaction chamber 12. At this time, the vapor phase precursor gas and the carrier gas are preferably introduced at a rate of 3:1, and the carrier gas and the reactive gas are preferably introduced into the reaction chamber 12 at a rate of 1:3.

The titanium precursor was additionally mixed with a selected one of DMB (di-methyl butadiene), THF (tetra hydro furan) or Hexane, as a volatile catalyst having a low boiling point. The catalyst can be mixed directly with the liquid titanium precursor, or a catalyst accommodated in a separate gas cylinder can be mixed at a pipe 66 or the vaporizer 40.

A mixed rate of the titanium precursor and the volatile catalyst was changed to 90:10~50:50.

The vapor phase precursor gas, the volatile catalyst, the carrier gas and the reactive gas were introduced into the reaction chamber 12 through the pipe 60 to be discharged directly above or directly under the metal sheet 18.

When a desired vacuum state in the chamber 12 is obtained by an injected gas, power is turned on and the metal sheet 18 was then moved to continuously form a plasma by the mixed gases between the electrodes 16. In response to this, the ultra-hydrophilic Ti—O—C based compound film was coated on both surfaces of the metal sheet 18.

During the plasma processing, a current was 1.0 A, a flow rate of the carrier gas, namely, helium or argon, was 800 sccm, a flow rate of the reactive gas, namely, oxygen or air, was 1500 sccm, and a flow rate of the vapor phase precursor gas was 1000 sccm. Also, during the plasma processing, the vacuum inside the chamber was maintained to be 0.2~0.35 Torr. The speed of introducing the metal sheet in to the chamber 12 was about 4 m/min.

Characteristic Analysis of Coating Film

A composition of the processed film substrate was analyzed by XPS (X-ray Photoelectric Spectroscopy) techniques, and a thickness thereof was analyzed by AES (Atomic Emission Spectrometry) techniques.

The thickness of the film according to the AES data was about 300 Å (30.0 nm), and the following Table 1 shows the ingredients according to a mixed rate of THF used as the volatile catalyst and the Ti precursor.

TABLE 1

|  | C | O | Ti | Si |
|---|---|---|---|---|
| Ti (100%) | 23.6 | 56.6 | 15.1 | 1.6 |
| Ti (70%) catalyst (30%) | 20.7 | 59.4 | 18.5 | 1.4 |
| Ti (50%) catalyst (50%) | 24.9 | 56.2 | 17.0 | 1.9 |

As the analyzed result, though there may be a slight difference depending on conditions, the titanium compound film according to the present invention was composed of 20~25% of C, 56~60% of O and 17~19% of Ti (by atomic percentage). It was recognized that the obtained compound film was a Ti—O—C based compound film.

In particular, it was noticed that the Ti content was greater than it was when using only the Ti precursor. As a result of this, it was possible to increase a thickness of deposition that will be explained hereafter.

FIG. 2 illustrates an SEM (Scanning Electron Microscope) photograph of a Ti—O—C based compound film according to the present invention. As shown in the photograph, a dense structure film was obtained and it was noticed that the film had an amorphous structure.

Figure 4:
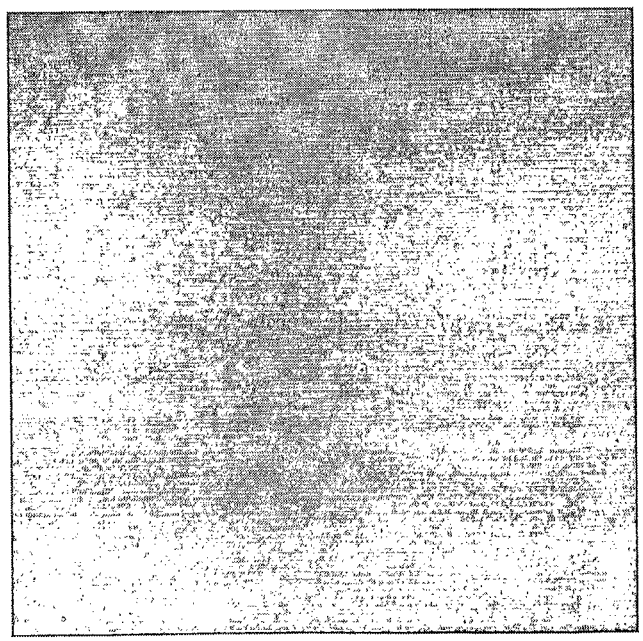

FIGS. 3 and 4 are photographs showing respective results from a test for corrosion resistance with respect to a bare Al sheet and an Al sheet with the Ti—O—C based compound film formed thereon. After spraying salt water on each sheet, respective surfaces thereof was examined after 15 days. As can be seen from the photographs, corrosion can be seen all over the bare Al sheet, however, it was noticed that the Al sheet with the coating film according to the present invention has a remarkably superior corrosion resistive characteristic, as the number of pitting was under 10.

Figure 5:
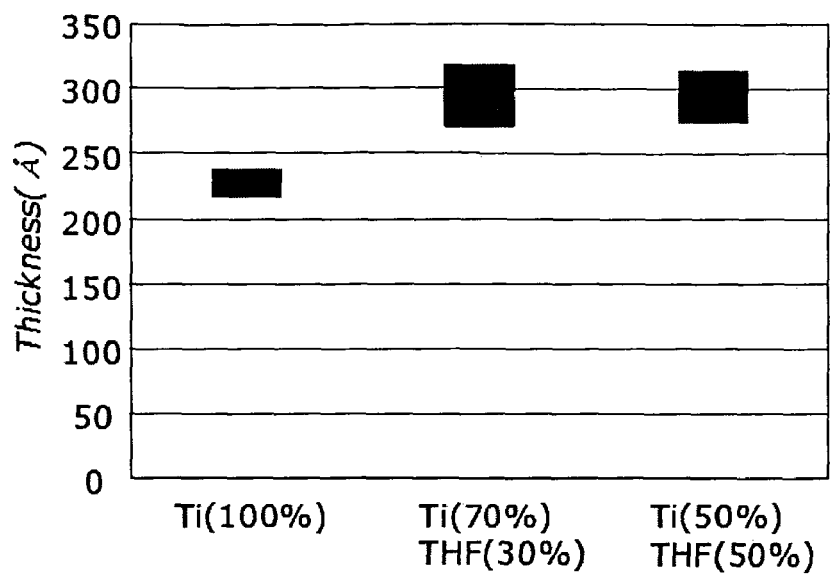
FIG. 5 is a graph comparing a deposition thickness depending on a mixing rate of the used materials.

A deposition thickness based on a mixed rate of the Ti precursor and the THF used as the volatile catalyst was examined, and the results thereof are shown in FIG. 5.

It was noticed that the deposition was thicker in case of mixing the Ti precursor and the THF, than in case of using only the Ti precursor (100% of Ti). The Ti—O—C based compound film according to the present invention shows a very excellent deposition efficiency, so as to improve productivity of a surface-treating processing of a metal sheet. This increase of the deposition efficiency is resulted from catalyzing a vaporization of the Ti precursor and improving the reactivity of the Ti by mixing the Ti precursor and the volatile catalyst.

Figure 6:
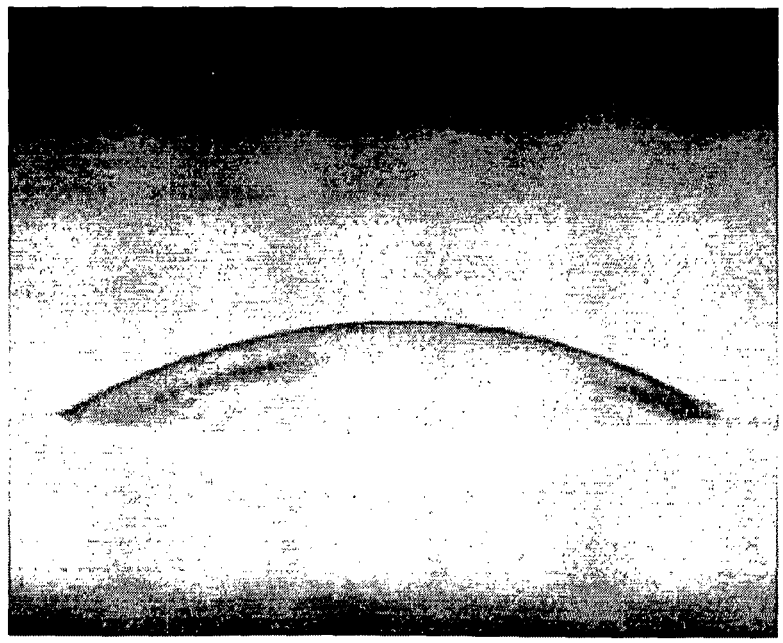
FIG. 6 is a photograph illustrating a spreading degree of droplets on a hydrophilic surface.

Then, the hydrophile properties of the Ti—O—C based compound film according to the present invention was estimated. It was achieved by measuring the droplet size on the substrate surface after dropping a droplet of 0.1 cc from a height of 10 mm. Having better hydrophile means that the droplet spread is better, which results in a larger size droplet on the surface. Having better hydrophobicity means that the droplet spread is worse, which results in a smaller size droplet on the surface. FIG. 6 shows the droplet shape on the Al 10 sheet surface having the coating film according to the present invention that is formed to have advantageous hydrophile properties. The diameter of the droplet was 9~11 mm, and it was noticed that the droplets spread on the surface at a remarkably fast speed.

In addition, in order to estimate an aging characteristic of the hydrophile, the hydrophile-processed substrate was made wet for ten minutes and dry for ten minutes, repeatedly, with distilled water, and accordingly the hydrophile properties after 300 cycles was compared with the initial hydrophile properties. The film according to the present invention that was processed by a plasma after a 300 cycle acceleration was recognized to have no variation of hydrophile properties thereof.

It is possible to obtain a coating film having an improved deposition thickness and a superior deposition uniformity by mixing, at a uniform ratio, the Ti precursor and a liquid having a low boiling point and a high volatility. Also, the additionally contained catalyst has a low cost, thus the a usage of the more costly Ti precursor can be reduced.

Furthermore, the catalyst accelerates a vaporization of the Ti precursor and facilitates the Ti precursor to be introduced into the reaction chamber, thereby improving plasma polymerization efficiency.

The metal sheet having the ultra-hydrophilic coating film thereon according to the present invention can be easily processed into a shape of a fin, and thus the processed metal sheet can be applied to a heat exchanger and utilized as other mechanical components.

The invention claimed is:

1. A method for fabricating an ultra-hydrophilic Ti—O—C based nano-film comprising:

positioning a substrate to be surface-treated in a reaction chamber in a vacuum state in which at least one electrode is installed;

introducing into the reaction chamber a Ti precursor gas, a reactive gas selected from air or oxygen, and a volatile catalyst having a low boiling point as a deposition accelerant of Ti, wherein a ratio of the Ti precursor and the volatile catalyst is 70:30-50:50;

applying a high voltage to the electrode and thus changing the introduced gases to a plasma state; and forming a Ti—O—C based nano-film on at least one surface of the substrate.

2. The method of claim 1, wherein the volatile catalyst is one selected among DMB (di-methyl butadiene), THF (tetrahydro furan) and Hexane.

3. The method of claim 1, wherein the Ti precursor is titanium tetraisopropoxide [$Ti(OC_3H_7)_4$].

4. The method of claim 1, wherein the Ti precursor, which is a liquid phase precursor, is vaporized to be introduced into the reaction chamber.

5. The method of claim 4, wherein the Ti precursor gas is vaporized with a heater coil to be heated to a temperature range of 80-120° C.

6. The method of claim 1, wherein the substrate to be surface-treated is made of metal.

7. The method of claim 6, wherein a direct current (DC) high voltage is applied to the substrate to be surface-treated.

8. The method of claim 7, wherein the substrate to be surface-treated is connected to an anode.

9. The method of claim 1, wherein the Ti precursor is carried into the reaction chamber by a separate carrier gas.

10. The method of claim 9, wherein the carrier gas is one selected among He, $N_2$ or Ar.

11. The method of claim 9, wherein the Ti precursor gas and the carrier gas are introduced at a ratio of 3:1.

12. The method of claim 9, wherein the carrier gas and the reactive gas are introduced at a ratio of 1:3.

13. The method of claim 1, wherein the substrate is continuously introduced between two electrodes installed at upper and lower sides in the reaction chamber, so as to successively coat ultra-hydrophilic titanium compound film on both surfaces of the substrate.

14. The method of claim 1, wherein the Ti precursor gas is introduced into the reaction chamber in admixture with a small amount of silicon precursor.

* * * * *